United States Patent
Rich et al.

[11] Patent Number: 5,924,431
[45] Date of Patent: Jul. 20, 1999

[54] ELECTRONIC COMPONENT CLEANING APPARATUS

[75] Inventors: Randall L. Rich, Plano; John R. Sanders, Dallas, both of Tex.

[73] Assignee: ACCEL, Plano, Tex.

[21] Appl. No.: 08/691,499

[22] Filed: Aug. 2, 1996

[51] Int. Cl.$^6$ .............................. B08B 3/02; B08B 5/00
[52] U.S. Cl. ........................... 134/25.4; 134/32; 134/68; 134/72; 134/126; 134/131
[58] Field of Search .................. 134/2, 26, 30, 134/34, 36, 48, 50, 60, 65, 94.1, 95.2, 95.3, 99.1, 25.4, 32, 68, 72, 126, 131

[56] References Cited

U.S. PATENT DOCUMENTS

| | | | |
|---|---|---|---|
| 3,868,272 | 2/1975 | Tardoskegyi | 134/26 |
| 4,026,701 | 5/1977 | Till et al. | 96/1 |
| 4,938,257 | 7/1990 | Morris | 134/64 R |
| 5,113,882 | 5/1992 | Gileta | 134/19 |
| 5,197,673 | 3/1993 | Sullivan | 239/102.1 |
| 5,501,735 | 3/1996 | Pender | 118/300 |
| 5,553,633 | 9/1996 | Ciccarelli, Jr. et al. | 134/72 |
| 5,684,252 | 11/1997 | Kessler | 73/618 |

FOREIGN PATENT DOCUMENTS

0 449 595  10/1991  European Pat. Off. .

*Primary Examiner*—Marian C. Knode
*Assistant Examiner*—Brenda G. Brumback
*Attorney, Agent, or Firm*—Sidley & Austin

[57] ABSTRACT

A cleaning apparatus (10) is disclosed for cleaning electronic components within JEDEC or Auer containers (59). The containers with electronic components and assemblies therein are conveyed through the apparatus by a conveyor assembly (18). A manifold assembly (16) defining precision planar surfaces (60) establishes a predetermined separation, preferably 0.020 inches, between the manifolds and the tops (57) of the containers (59) to prevent the electronic components and assemblies from being lifted out of the containers under the influence of the washing and rinsing operation The manifolds have apertures formed therethrough for spraying the washing and rinsing fluids and drying gases onto the electronic components and assemblies.

19 Claims, 10 Drawing Sheets

ELECTRONIC COMPONENT CLEANING APPARATUS

TECHNICAL FIELD OF THE INVENTION

This invention relates to the cleaning of electronic components, modules, and assemblies and in particular to an apparatus to clean the components as the components are held in JEDEC trays, Auer boats, or similar type containers.

BACKGROUND OF THE INVENTION

It is often necessary to remove RMA, RA and OA fluxes, flux residues, particulates and other contaminates from small electronic components and assemblies after soldering operations. Assemblies which require such cleaning include multi-chip modules, ball grid, flip chip, hybrid circuits, SMT assemblies, PCM-CIA and mixed technology electronic assemblies.

In many electronic manufacturing operations, electronic components and assemblies pass through soldering operations on a belt while being held in a tray, such as a JEDEC tray, or boat such as an Auer boat. These electronic components and assemblies must then be cleaned to remove flux residues and contaminates. It is therefore desirable to design an apparatus for cleaning such electronic components and assemblies as they pass through on a belt and are contained in a tray or boats.

SUMMARY OF THE INVENTION

An apparatus is provided for cleaning electronic components and assemblies. The apparatus includes a frame and a conveyor mounted on the frame for conveying a container holding the electronic components along a first direction. A manifold is provided which has a planar surface facing the conveyor. The planar surface parallel to the first direction and is separated a predetermined distance from the conveyor. The container is confined between the conveyor and the planar surface of the manifold to prevent electronic components and assemblies from escaping the container as the electronic components and assemblies are cleaned. The manifold is positioned a small distance from the open top of the container to form a ceiling to the container. The manifold has passages therethrough for passage of cleaning fluids and gases to treat the electronic components and assemblies.

In accordance with another aspect of the present invention, the apparatus is divided into a wash section, a rinse section and a dry section. The apparatus has a wash conveyor and a wash manifold and a separate rinse/dry conveyor and a rinse manifold and a dry manifold. The wash manifold preferably has nitrogen or air spray bars to isolate the wash section and solvent spray bars to wash the electronic components and assemblies. The rinse manifold preferably has solvent spray bars to rinse the electronic components and assemblies and the dry manifold preferably has gas spray bars to dry the electronic components and assemblies.

BRIEF DESCRIPTION OF THE DRAWINGS

A more complete understanding of the invention and its advantages will be apparent from the following detailed description when taken in conjunction with the accompanying drawings, in which.

DETAILED DESCRIPTION

Figure 1:
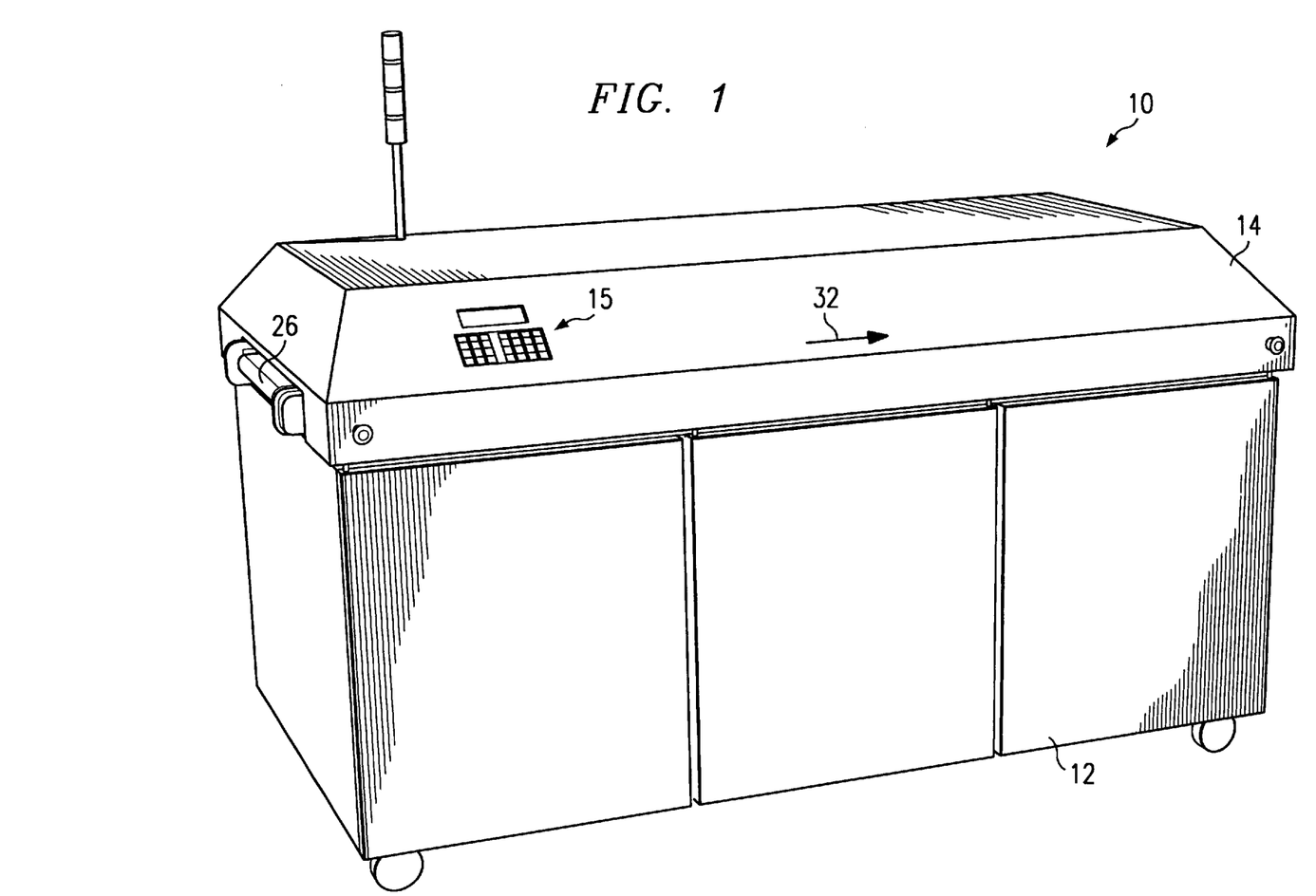
FIG. 1 is perspective view of a cleaning apparatus forming a first embodiment of the present invention.
Figure 2:
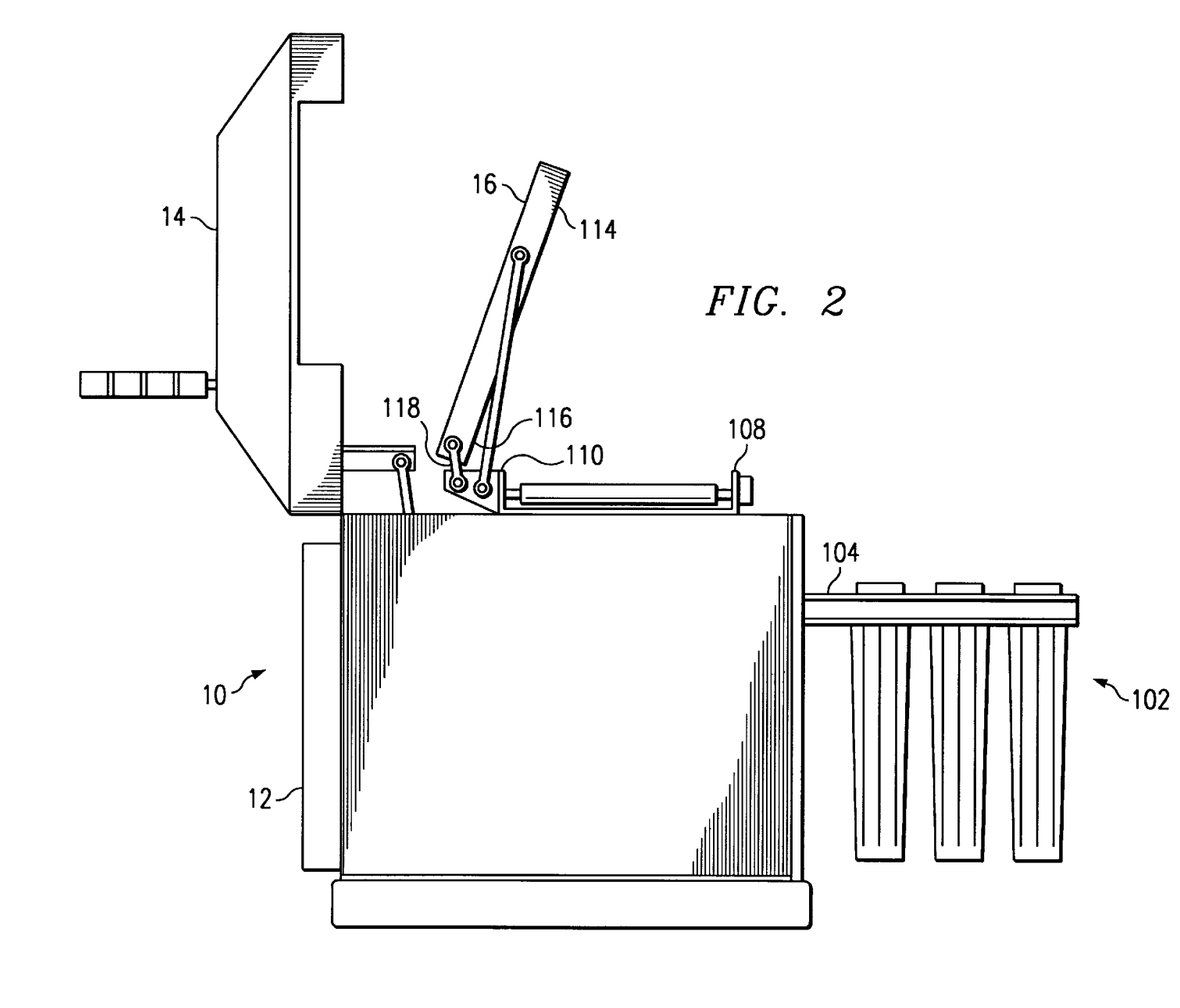
FIG. 2 is an end view of the cleaning apparatus illustrating the cover and manifold assembly tilted upward.

Referring now to the drawings, wherein like reference characters designate like or corresponding parts throughout the several views, and in particular to FIG. 1, a cleaning apparatus 10 is illustrated which is used to clean electronic components and assemblies. As will be described, the cleaning apparatus 10 is an automatic, in-line spray cleaning system which uses solvents to remove RMA, RA and OA fluxes, flux residues, particulates and other contaminants from small electronic components and assemblies. Components and assemblies most often cleaned in apparatus 10 include multi-chip modules, ball grid arrays, flip chip, hybrid circuits, SMT assemblies, PCM-PIA and mixed technology electronic assemblies. As will be described in greater detail, the apparatus is uniquely designed to hold the components and assemblies in their handling containers, typically either a JEDEC tray, Auer boat, or similar container, during the cleaning process despite fluids and gases impacting on the electronic components and assemblies at high velocity. This is achieved by precisely establishing a very small gap between the tops of the containers and the manifolds in the apparatus discharging cleaning fluids or gases to prevent electronic components and assemblies from escaping from the containers. JEDEC trays are typically 5/16" high and 5" by 12". They may have five rows of 12 compartments or three rows of eight compartments to hold electronic components and assemblies. The compartments may have a solid floor or partially open floor to allow fluids to pass through the trays around the electronic components and assemblies.

Figure 4:
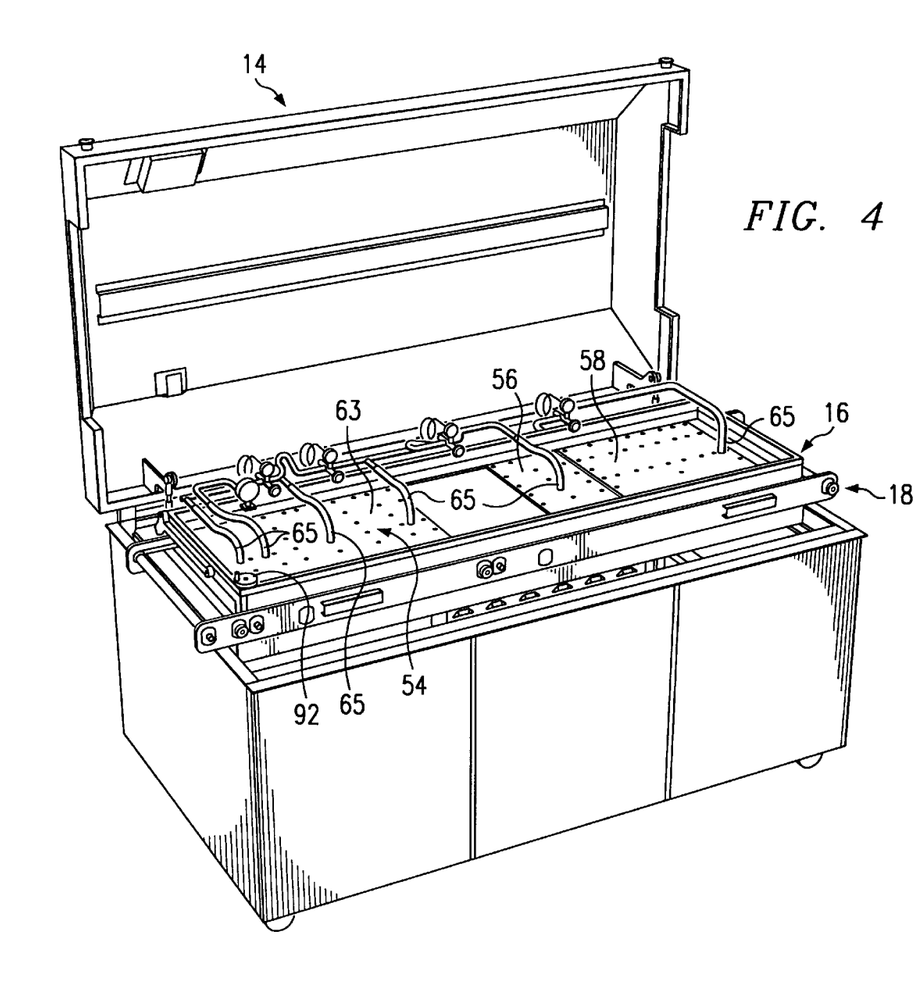
FIG. 4 is a perspective view of the apparatus showing the cover open.
Figure 5:
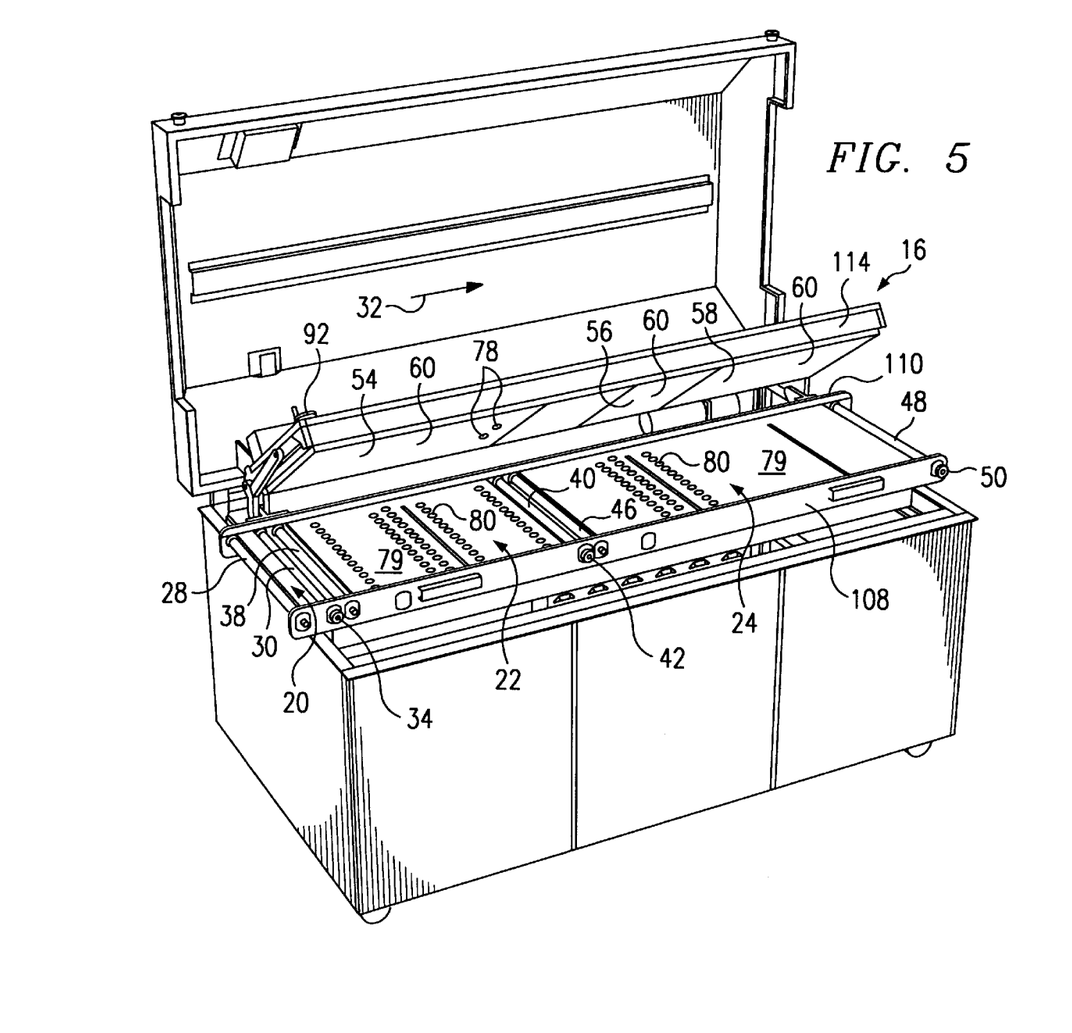
FIG. 5 is a perspective view of the apparatus showing the manifold assembly lifted.
Figure 6:
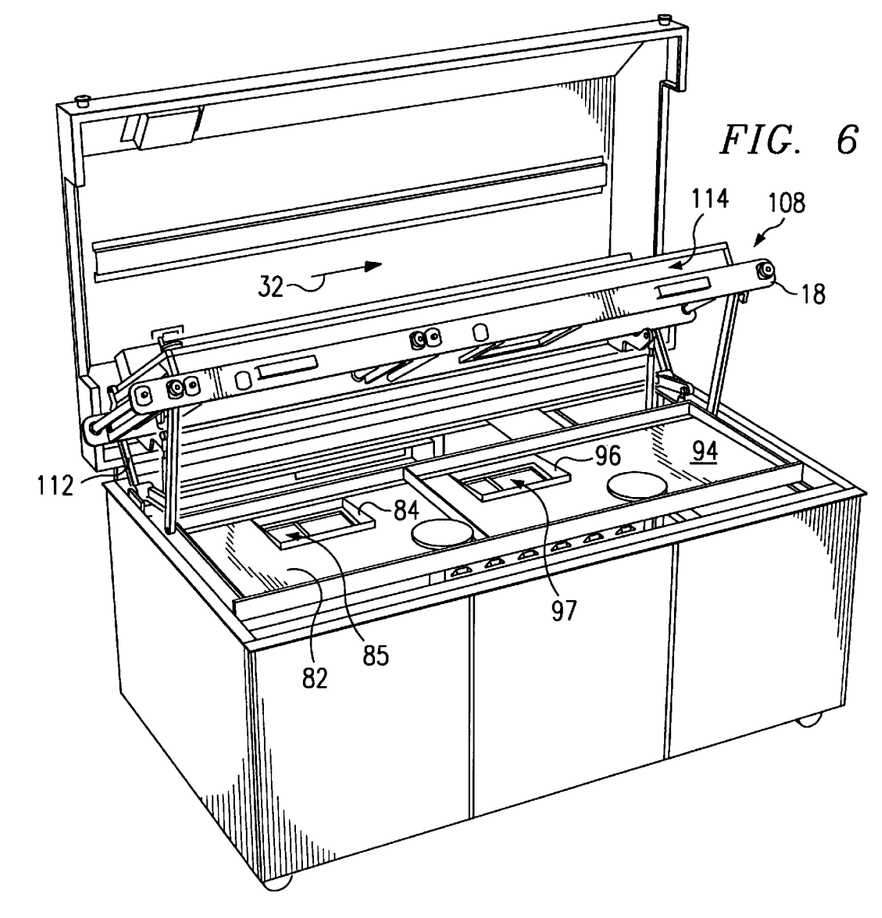
FIG. 6 is a perspective view of the cleaning apparatus showing the manifold assembly and the conveyor assembly lifted.
Figure 7:
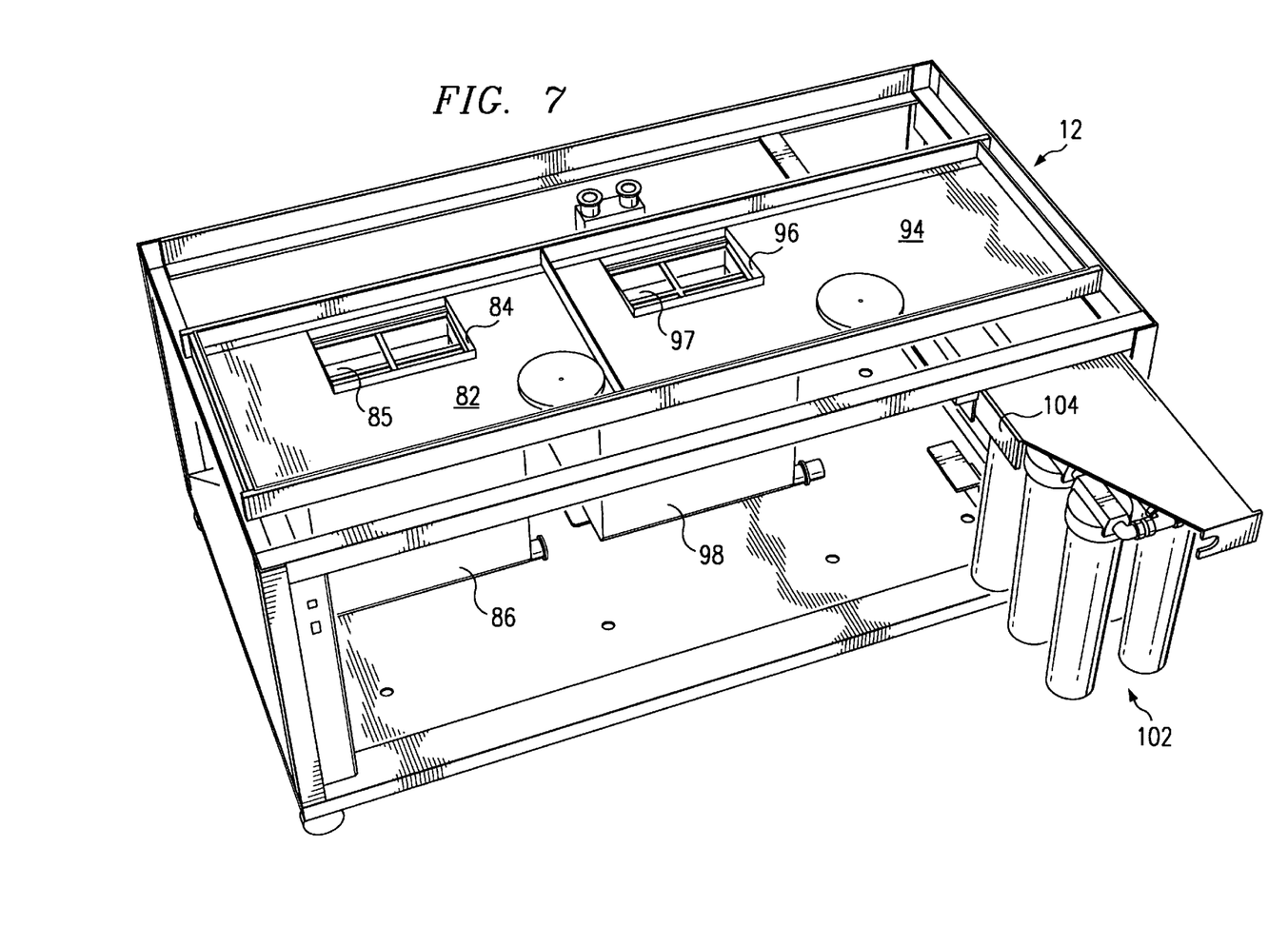
FIG. 7 is a partially disassembled perspective view of the cleaning apparatus illustrating the wash and rinse trays and storage containers.
Figure 8:
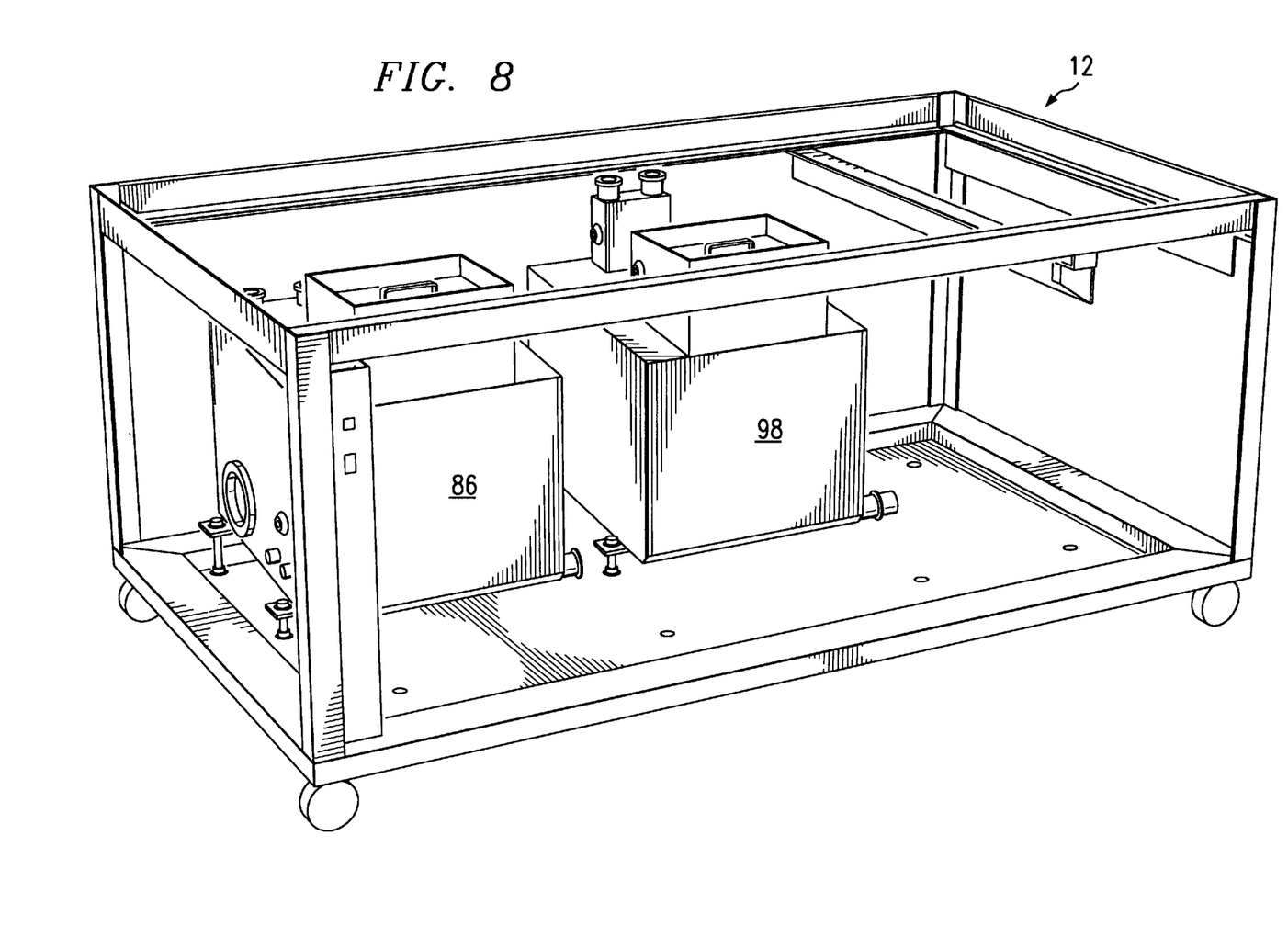
FIG. 8 is a partially disassembled perspective view of the cleaning apparatus showing the wash and rinse containers.

The cleaning apparatus 10 is completely selfcontained and occupies a small floor area, perhaps 84" long by 50" deep, for example. The apparatus 10 includes a frame 12 which mounts a cover 14 on hinges, allowing the cover to be tilted upward as seen in FIG. 4. During operation, the cover 14 will be closed, as seen in FIG. 1, to provide maximum isolation of the operations within the apparatus from the environment. Also, cover 14 mounts control panel 15 to allow operator input of control parameters. The frame further mounts a manifold assembly 16 which can be pivoted upwardly as seen in FIG. 5 for servicing and inspection. The frame further mounts a conveyor assembly 18 which can also be pivoted upwardly for servicing and inspection as seen in FIG. 6.

The containers 59 (see FIG. 10) with electronic components and assemblies are inserted at one end of the apparatus (the left end as seen in FIGS. 1 and 4–8) between the manifold assembly and conveyor assembly and conveyed through the apparatus by the conveyor assembly while being washed, rinsed and dried by the manifold assembly.

The conveyor assembly 18 operates three separate conveyors for moving containers and the electronic components and assemblies therein through the apparatus in the direction of arrow 32: an entry conveyor 20, a wash conveyor 22 and a rinse/dry conveyor 24. The entry conveyor 20 includes a stainless steel mesh conveyor belt 26 constrained about idler roller 28 and drive roller 30. The container with the electronic components and assemblies to be cleaned is placed on the portion of the entry conveyor extending from the entry end of the apparatus, as seen in FIG. 1 and the entry conveyor draws the container into the apparatus. Preferably, the entry conveyor extends about six inches along the direction of movement of the electronic components through the apparatus represented by arrow 32. The drive roller 30 mounts a gear 34 at one end thereof to drive the rollers and belt.

The wash conveyor 22 has a stainless steel mesh conveyor belt 36 which extends between idler roller 38 and drive roller 40. Drive roller 40 has a gear 42 at one end thereof. The length of the wash conveyor is preferably about twenty-four inches along the direction of arrow 32.

The rinse/dry conveyor 24 has a stainless steel mesh conveyor belt 44 which extends around idler roller 46 and drive roller 48. A gear 50 is mounted at one end of the drive roller 48. A chain assembly engages each of the gears 34, 42 and 50 to drive the conveyors at the same speed. A single motor, preferably a single gear reduction motor, drives the chain assembly.

The manifold assembly 16 mounts wash manifold 54, rinse manifold 56 and drying manifold 58. As best seen in FIG. 5, each of the manifolds defines a planar surface 60 which extends parallel the direction of movement of the electronic components and assemblies along the direction of arrow 32.

The distance G from the planar surface 60 of the manifolds to the open top 57 of the JEDEC or Auer containers 59 moving along the conveyors is adjustable and precisely controlled. The adjustment is provided by mounting the manifolds 54, 56 and 58 for slight vertical motion relative to the remainder of the manifold assembly 16 perpendicular the direction of motion of arrow 32. The vertical motion is adjusted by an adjustment wheel 92. Preferably, the distance should be about 0.020 inches, but no more than the smallest dimension of the electronic components and assemblies being treated. This provides a mechanism to prevent the electronic components and assemblies from being thrown from the containers 59 under the influence of the washing, rinsing and drying cycles. The planar surfaces 60 thus act as a ceiling or lid to the container. Preferably, the manifolds are adjustable simultaneously by adjustment wheel 92 to provide fine adjustment of the separation G between the planar surfaces of the manifolds and the tops of the compartments. In addition to preventing the electronic components and assemblies from being thrown from the compartments, the close tolerances prevent excessive escape of solvent and rinsing materials from the apparatus.

In one machine constructed in accordance with the teachings of the present invention, the separation G is adjustable between zero and 1.075 inches. The separation G will typically be kept in the range of 0.010 to 0.050 inches since the typical part thickness of the electronic components and assemblies being treated is approximately 0.060 inches. Clearly, the separation G should be of dimensions less than the dimensions of the electronic components and assemblies being treated to prevent the electronic components and assemblies from being thrown out of the compartment. A typical component or assembly being treated would be a device 140 with square dimensions of 25 millimeters by 25 millimeters and a thickness T of 0.040 to 0.060 inches. The electronic component or assembly will typically have solder balls 142 of thickness S of 0.003 to 0.030 inches on one side thereof, making the total thickness from 0.043 to 0.090 inches. For such an electronic component or assembly, the separation G would be maintained at less than 0.043 inches. A JEDEC tray is 12 inches by 5 inches by 0.300 inches high and is made of high temperature plastic. An Auer boat is 12 inches by 3.1 inches by 0.375 inches high and is made of stainless steel sheet metal. In the machine, the thickness of the manifolds 54, 56 and 58 was three quarters of an inch while the thickness of the cover 63 was 0.375 inches. The diameter of apertures 78 is 0.012 for liquid discharge and 0.022 for gas discharge.

Figure 9:
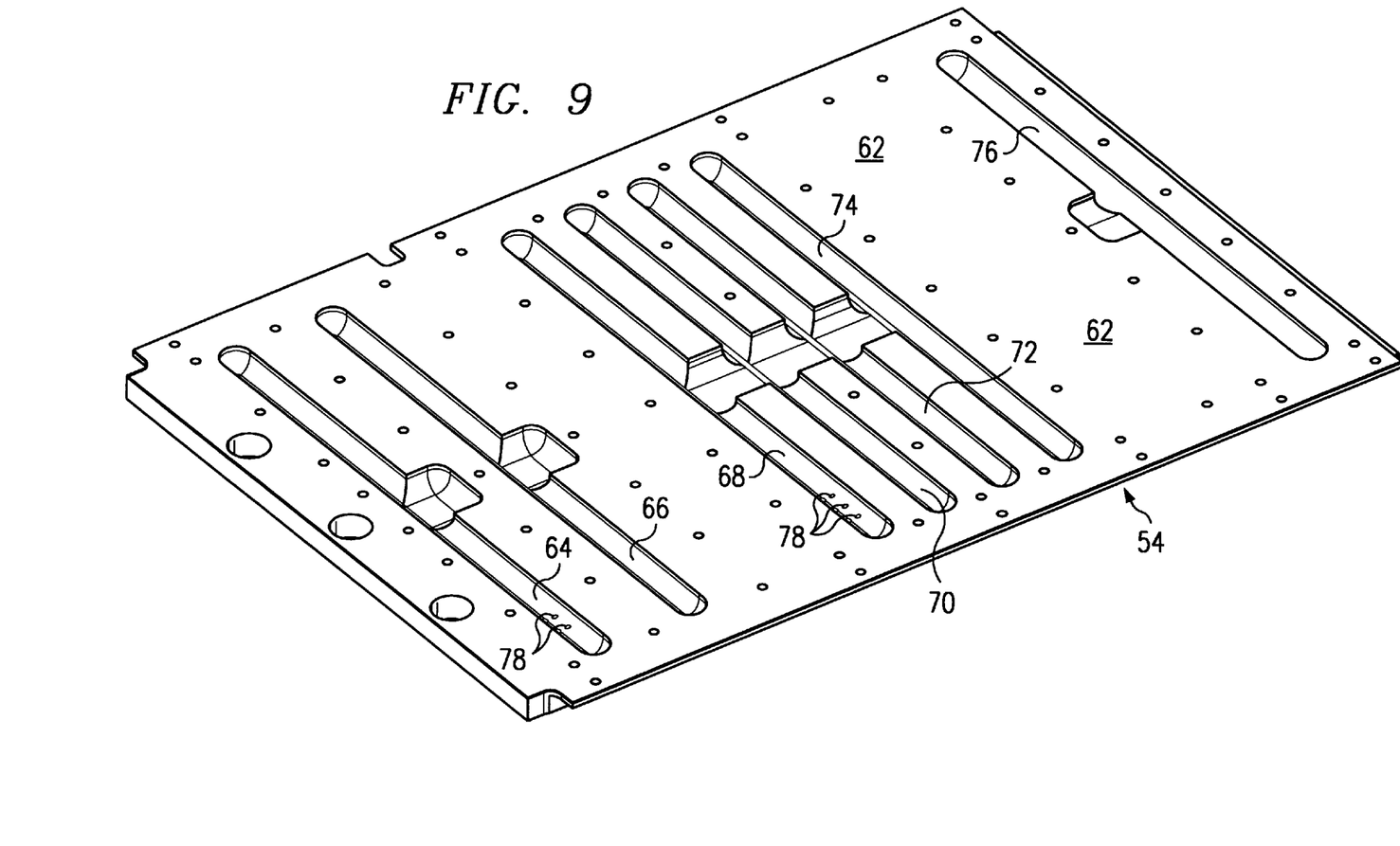
FIG. 9 is a perspective view of a manifold used in the cleaning apparatus.
Figure 10:
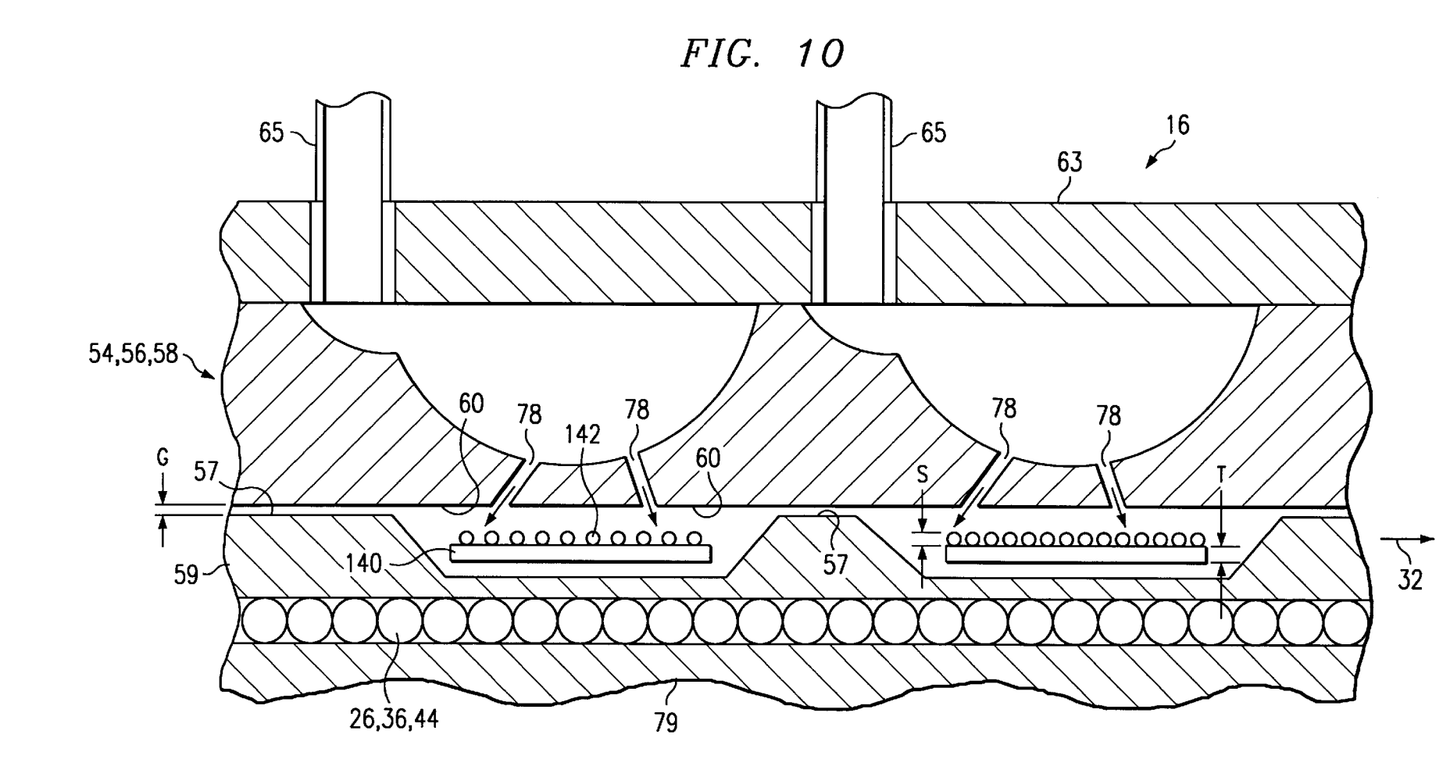
FIG. 10 is an illustrative cross-sectional view of a container between a conveyor and manifold.

With reference to FIGS. 9 and 10, the wash manifold 54 will be described The manifold includes a series of channels formed through the upper surface 62 of the manifold opposite the planar surface 60. A manifold cover 63, shown in FIG. 4, is bolted to upper surface 62 and encloses the channels. Cover 63 mounts the supply lines 65 for discharging the various fluids and gases used into the channels described below as seen in FIG. 4. A nitrogen channel 64 is formed at the upstream end of the wash manifold 54, followed by a series of five solvent channels 66, 68, 70, 72 and 74. Finally, another nitrogen channel 76 is at the downstream end of the manifold. A series of small apertures 78 are formed near the bottom of each channel and along the entire length of the channel which open through the planar surface 60 of the manifold to spray either nitrogen or solvent on the electronic components being washed. The nitrogen channel 64 forms an entry nitrogen spray zone which isolates the wash section from the ambient air and acts to inert the wash section atmosphere for safe operation of low flash point solvents. Solvents will then be dispensed on the electronic components in the wash section from channels 66–74. The nitrogen channel 76 acts to isolate the wash zone from the adjacent rinse zone and strips solvent off the electronic components before they enter the rinse section.

Figure 3:
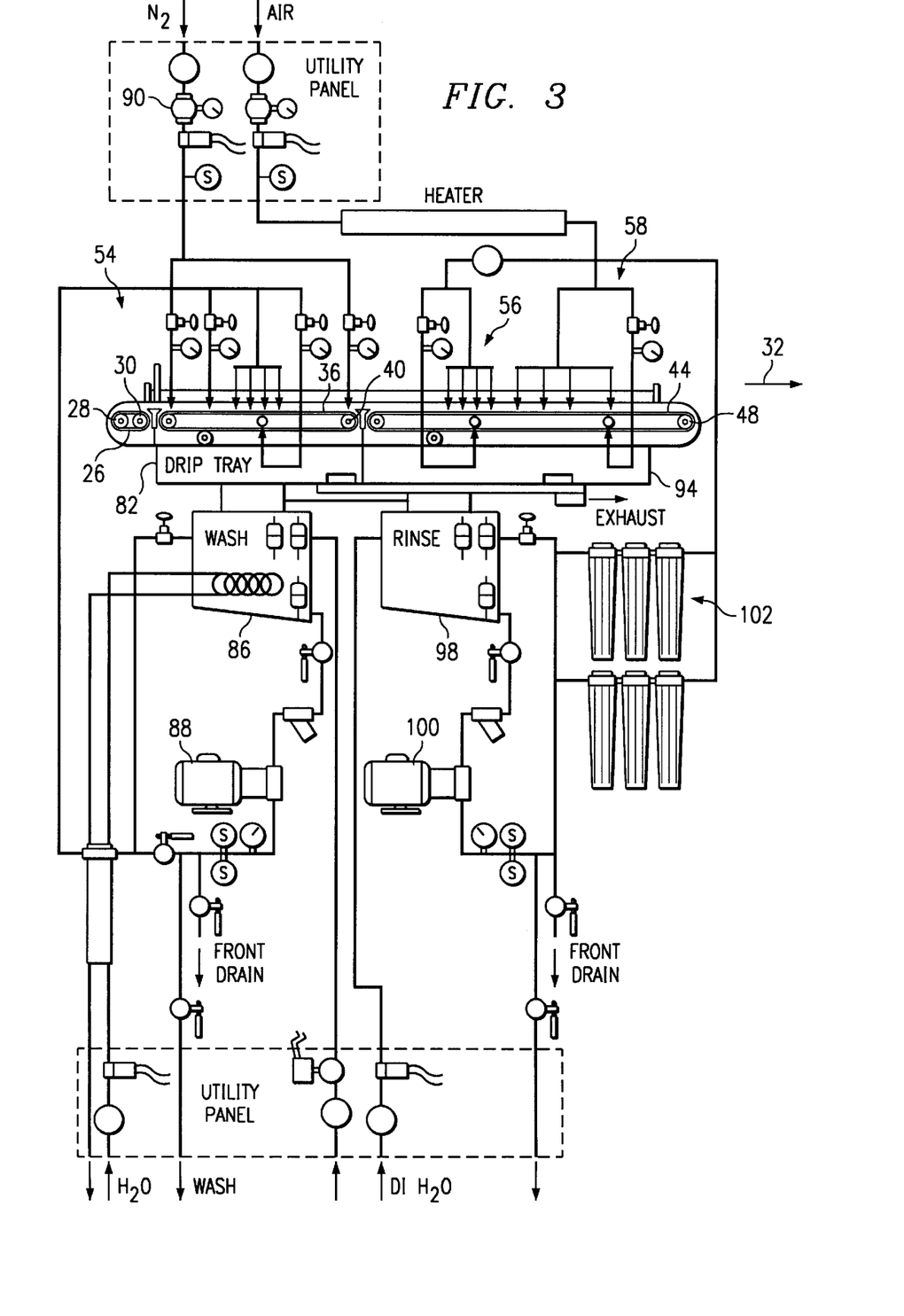
FIG. 3 is a flow schematic of the cleaning apparatus.

As seen in FIG. 3, solvent spray discharge nozzles are preferably provided below the electronic components as well which provide a two-sided washing action on the components. The wash conveyor 22 and rinse/dry conveyor 24 each have plates 79 along which the conveyor belts 36 and 44 are guided. The plates 79 and surfaces 60 are separated by a precise distance to insure the top 57 of the containers 59 and the surfaces 60 are separated the desired distance G. The plates 79 have a series of holes 80 therethrough to permit the solvents to be sprayed from below the electronic components and assemblies. The conveyor belts 36 and 44 will have an open mesh to permit passage of the solvents.

After the solvents are discharged against the electronic components and assemblies for washing, the solvents and removed materials will drip by gravity through the wash conveyor into a solvent drip tray 82 mounted in the frame. From solvent drip tray 82, the solvent is directed through a drain 84 and filter 85 into solvent container 86. The solvent is pumped from the container 86 by solvent pump 88 and pumped to the wash manifold 54 for discharge against the electronic components and assemblies, forming a continuous cycle. The nitrogen is preferably provided from exterior the apparatus 10 through a pressure control mechanism 90 on the apparatus.

The containers 59 containing the electronic components and assemblies move from the wash section to the rinse section under the action of conveyor belts 36 and 44. Rinse manifold 56 provides three parallel channels for delivery of de-ionized water to the electronic components for rinsing. Again, spray nozzles can be provided below the container for upward spray to assist in the rinsing operation. After rinsing, the water flows by gravity into rinse tray 94 where it drains through drain 96 and filter 97 into the rinse container 98. The water is pumped from the rinse container by a rinse pump 100 and supplied to a series of filters 102 for absorbing organic in carbon, filtering particulates therefrom and restoring resistivity using mixed bed resin. The filters 102 are preferably mounted on a filter frame 104 which allows them to be slid out easily for change when necessary. After filtering, the water is then again sprayed on the electronic components and assemblies.

Finally, the drying manifold 58 has a series of air channels for discharge of heated air against the electronic components and assemblies to dry the components and assemblies. Again, manifolding is provided to blow hot air from beneath the electronic components and assemblies as well as through the manifold 58. The electronic components and assemblies are then conveyed to the end of the apparatus 10 where they can be removed.

Preferably, the majority of elements within the apparatus are formed of 316 stainless steel for a long service life. Further, fittings are preferably of the compression type.

The conveyor assembly 18 preferably has precision ground rails 108 and 110 mounted to the frame through a four-bar linkage 112 The manifold assembly 16 has precision ground rails 114 and 116 which, with rails 108 and 110, provide extremely close tolerances between the conveyor and manifolds and therefore between plates 79 and surfaces 60. The manifold assembly 16 is further mounted on a four-bar linkage 118.

Although a single embodiment of the present invention has been illustrated in the accompanying drawings and described in the foregoing detailed description, it will be understood that the invention is not limited to the embodiment disclosed, but is capable of numerous rearrangements, modifications and substitutions of parts and elements without departing from the scope and spirit of the invention.

We claim:

1. An apparatus for cleaning electronic components and assemblies contained in, but not secured to, a container having an open top, the container holding the electronic components and assemblies, comprising:
   a frame;
   a conveyor mounted on the frame for conveying the container holding the electronic components and assemblies along a first direction lying within a first plane;
   a manifold having a planar surface facing the conveyor, the planar surface parallel the first plane and separated a predetermined distance from the conveyor, the container being confined between the conveyor and the planar surface of the manifold with the planar surface of the manifold sufficiently close to the open top of the container to prevent the unattached electronic components and assemblies from escaping from the containers as the electronic components and assemblies are cleaned and dried, the manifold having passages therethrough for passage of cleaning fluids.

2. The apparatus of claim 1, wherein the separation between the planar surface and the open top of the container is adjustable and is about 0.020 inches.

3. The apparatus of claim 2 where in the separation between the planar surface and the open side of the container is adjustable with an adjustment whase.

4. The apparatus of claim 1, wherein said conveyor is a wash conveyor and said manifold is a wash manifold, the apparatus further having a rinse/dry conveyor mounted on the frame for conveying the container along the first direction and a rinse/dry manifold having a planar surface facing the rinse/dry conveyor, the planar surface of the rinse/dry manifold being parallel the first plane and separated a predetermined distance from the rinse/dry conveyor, the container being confined between the rinse/dry conveyor and the rinse/dry manifold, the planar surface of the rinse/dry manifold sufficiently close to the open top of the container to prevent electronic components and assemblies from escaping therefrom as the electronic components and assemblies are rinsed, the rinse/dry manifold having passages therethrough for passage of rinsing fluids and passages therethrough for passage of drying gases.

5. The apparatus of claim 1 further having a cover, the cover mounted on the frame for movement between a closed position and an opened position.

6. The apparatus of claim 1, wherein the conveyor is mounted on a conveyor assembly, the conveyor assembly pivotally mounted on the frame for movement between a operational position and a servicing position.

7. The apparatus of claim 1, wherein the manifold is mounted on a manifold assembly, the manifold assembly pivotal between an operational position and a servicing position.

8. The apparatus of claim 1 wherein the conveyor is mounted on a conveyor assembly and the manifold is mounted on a manifold assembly, each of said assemblies having a pair of precision ground rails, the rails of the conveyor assembly mating with the rails of the manifold assembly to maintain the predetermined distance.

9. The apparatus of claim 1 wherein the container is a JEDEC tray.

10. The apparatus of claim 1 wherein the container is an Auer boat.

11. The apparatus of claim 1 wherein the conveyor is mounted on a conveyor assembly, the conveyor assembly pivotally mounted on the frame for movement between an operational position and a servicing position;
   the manifold being mounted on a manifold assembly, the manifold assembly pivotal between an operational position and a servicing position, the first plane and plane of the manifold being horizontal when the manifold is in the operational position.

12. The apparatus of claim 11 wherein the manifold assembly is mounted on a four bar linkage to the frame.

13. A method for cleaning electronic components and assemblies, comprising the steps of:
   confining the electronic components and assemblies within a container with the electronic components and assemblies unsecured to the container having an open top lying in a first plane with a manifold having a planar surface facing the container, the planar surface separated a predetermined distance from the first plane containing the open of the container sufficiently small to prevent the unattached electronic components and assemblies from escaping from the containers as the electronic components and assemblies are cleaned;
   moving the container in a first direction within the first plane and parallel the planar surface of the manifold; and
   treating the electronic components and assemblies within the container by fluids or gases flowing through the manifold.

14. The method of claim 13, wherein the method further includes the steps of adjusting the predetermined distance between the container and the planar surface of the manifold.

15. The method of claim 13 wherein the electronic components and assemblies have a smallest predetermined dimension, the predetermined distance from the container to the planar surface of the manifold being less than said smallest predetermined dimension to prevent the electronic components and assemblies from escaping the container during treatment.

16. If The method of claim 13 further comprising the step of maintaining a predetermined distance within the range of about 0.010 inches to 0.050 inches.

17. The method of claim 13, wherein the step of moving the container in the first direction further comprises the step of conveying the container on a conveyor belt.

18. The method of claim 13 wherein the step of confining the electronic components and assemblies within a container includes the step of confining the electronic components and assemblies within a JEDEC tray having an open top.

19. The method of claim 13 wherein the step of confining the electronic components and assemblies within a container further includes the step of confining the electronic components and assemblies within an Auer boat having an open top.

* * * * *

UNITED STATES PATENT AND TRADEMARK OFFICE
CERTIFICATE OF CORRECTION

PATENT : 5,924,431
DATED : July 20, 1999
INVENTOR(S) : Randall L. Rich and John R. Sanders It is certified that error appears in the above-identified patent and that said Letters Patent is hereby corrected as shown below:

Column 1, line 15, insert --arrays-- after "flip chip" and before the comma.
Column 3, line 44, change "perpendicular" to --parallel--.
Column 5, line 31, insert --.-- (a period) after the number "112".
Column 6, line 3, (claim 3), change "whase" to --wheel--.
Column 6, line 58, (claim 13), insert --top-- after "open".
Column 7, line 12, (claim 16), "If" should be deleted.

Signed and Sealed this

First Day of August, 2000

*Attest:*

*Attesting Officer*

Q. TODD DICKINSON

*Director of Patents and Trademarks*